United States Patent Office 3,346,383
Patented Oct. 10, 1967

3,346,383

IMAGE REPRODUCTION PROCESSES UTILIZING PHOTOPOLYMERIZATION OF VINYL MONOMER COMPOSITIONS COMPRISING A METALLIC SULFIDE COMPOUND

Ralph W. Baxendale, George W. Luckey, and Henry C. Yutzy, Rochester, N.Y., assignors to Eastman Kodak Company, Rochester, N.Y., a corporation of New Jersey No Drawing. Filed Nov. 23, 1960, Ser. No. 71,141
24 Claims. (Cl. 96—35.1)

This invention relates to new photosensitive compositions and more particularly to new photosensitive polymerizable compositions comprising an ethylenically unsaturated monomeric component and a solid, inorganic photocatalytic initiator of photopolymerization. It is also related to special processes for preparing the photocatalytic initiators for photopolymerization and to processes whereby photopolymerizable elements prepared therewith can be employed in a photographic reproduction process.

The advantages of the solid photocatalyst in the rapid formation of images by the photopolymerization of unsaturated vinyl monomers are of technical importance because of the interest in obtaining improved office copying methods and improved images in relief for use in the art of photomechanical reproduction. Although inorganic pigments have been used as coloring materials and filters in plastic compositions, chemical accelerators, modifiers and peroxidic compounds have been necessary for the photopolymerization of such mixtures. The art has apparently been unable to deduce methods of preparing photopolymerizable compositions where inorganic solid photocatalytic initiators of photopolymerization alone in the preparation are employed.

It is therefore an object of this invention to provide new photopolymerizable compositions. Another object is to provide compositions which are readily photopolymerizable to high polymers without requiring the need for chemical accelerators, modifiers and peroxidic compositions. A further object is to provide a photographic element having a dry coating thereon of a photopolymerizable composition and to provide such elements which have improved storage stability. A still further object is to provide a process of preparing photo-activatable photocatalysts for use in storage-stable photopolymerizable compositions. Still another object is to provide a process for photographic reproduction which comprises transferring unhardened, unpolymerized composition to a receiving sheet. And still another object is to provide photopolymerizable elements having layers of aforesaid compositions which after exposure can be developed with simple spray techniques using a suitable solvent to produce printing reliefs or photographic reproductions therefrom.

These objects are accomplished by exposing to an appropriate actinic light source a photopolymerizable composition comprising (1) a liquified ethylenically unsaturated monomeric component and (2) a solid, inorganic photocatalytic compound selected from the group consisting of substantially water-insoluble metallic sulfides, metallic halides, and metallic oxides. The solid, inorganic photocatalysts particularly suitable for use in the present invention comprise cadimum sulfide, zinc sulfide, zinc oxide, mercuric iodide, mercuric iodosulfide, thallous bromide, bismuth oxychloride, lead bromide, and titanium dioxide. The inorganic photocatalyst for use in the present invention should be in finely-divided form and should be low in residual impurity. In preparing the photopolymerizable compositions, it is usually advantageous to use freshly prepared precipitate. Suitable processes for preparing precipitates of the inorganic photocatalyst of the invention comprise the following. For example, cadmium sulfide precipitate for use in the photopolymerizable composition was formed by the chemical interaction of an aqueous solution of a cadmium halide and a sulfide such as hydrogen sulfide, alkali metal sulfides (e.g., sodium and potassium sulfides), etc. In like manner, zinc sulfide, for example, was prepared as a precipitate by the chemical interaction of a zinc halide such as zinc chloride and a sulfide as available from hydrogen sulfide and alkali metal sulfides. Thallous bromide was prepared by precipitation from solutions of thallous nitrate and potassium bromide contained at a concentration of 1 gram of each reactant per liter of water.

Where inorganic photocatalytic compounds of this invention are formed by precipitation, the precipitate can advantageously be washed with water to remove excess hydrogen sulfide, hydrochloric acid by-product, or unreacted inorganic residue. Washing of the precipitate can be carried out by any known method. Particularly suitable results have been obtained by decantation and by dialysis. Dialysis, although slower than decantation, was found to produce a metallic slurry very low in residual impurity. A very low residual content can also be achieved by adding to the washed slurry an amount of a heavy metal ion sufficient to react with the residual reactive materials.

By including the dialysis step in the preparation of the inorganic photocatalysts of this invention which are formed by precipitation in aqueous solution, it was found that the safe storage period for the photopolymerizable compositions and for photographic elements prepared therefrom could be increased from a period of a few days to a period of from about six to eight weeks. When we refer to a safe storage period, we mean that period of time wherein polymerizable compositions can be held in storage without premature polymerizing and without substantial loss of light sensitivity. It was also found that photopolymerizable compositions and corresponding photographic elements prepared therefrom could be safely stored for a period of about twelve weeks where an antioxidant, such as ascorbic acid, 2-tertiarybutyl-4-methoxyphenol, and 2,5-ditertiarybutylhydroquinone, was added to the photocatalyst slurry prior to its incorporation into the polymerizing composition.

In the preparation of the solid inorganic initiators of photopolymerization, it was found that the activity of certain of the photocatalysts, particularly the sulfide photocatalysts, could be extended to function as photocatalytic addendum in organic-soluble monomeric compositions where the photocatalyst was given an additional washing by decantation with an organic solvent, such as 2-ethoxyethanol, 2-methoxyethanol, and formamide. By such treatment the photocatalyst can be employed in the photopolymerization of such organic soluble monomers as styrene, methyl methacrylate, N-substituted acrylamides, e.g., N-hydroxyethyl acrylamide, etc. The present invention, however, is primarily concerned with water-soluble ethylenically unsaturated monomeric compounds and particular emphasis on such compounds will be made herein. Suitable water-soluble compounds which can be used in our invention can comprise any of the known polymerizable organic vinyl or vinylidene compounds and preferably polymerizable compounds, such as acrylic acid, acrylamide, methacrylamide, metal acrylates, e.g., calcium acrylate, etc., acrylonitrile, vinyl pyrrolidone, vinyl pyridine, and quaternary salts (e.g., 1,2-dimethyl-5-vinylpyridinium methosulfate, etc.). Particularly well suited for use in the dry coating compositions of our invention is acrylamide because it is a solid, soluble in a variety of solvents and is stable without refrigeration and inhibitors. Acrylamide, methacrylamide, and calcium acrylate are particularly suitable for producing homogeneous mixtures with binding and vehicular substances such as zein, nylon, monostearin (glycerol monostearate), ethylcellulose, polyvinylpyrrolidone, maleopimaric acid, methylmethacrylate-methacrylic acid copolymer, polymethacrylic acid, polyvinyl hydrogen phthalate, cellulose acetate phthalate, and polyethylene glycols such as Carbowax 4,000 to Carbowax 20,000. The numbers given Carbowax materials such as Carbowax 4,000 to Carbowax 20,000 indicates the approximate molecular weight of such polyethylene glycol substances.

In a process of the present invention, the unhardened, unpolymerized composition is transferred by mild heat application to a second support or receiving sheet. In this process at least one suitable vehicular substance such as those presented above can be advantageously incorporated into the polymerizing composition. Such vehicular substance, of course, should be compatible with the system, i.e., with the other ingredients of the composition, such as the monomer. Advantageously the vehicular substance should have a softening or melting point above 50° C. and should exhibit a mixed melting point depression with a particular monomer. By mixed melting point depression, we mean that the mixture of the monomer and vehicular substance has a substantially lower melting point than either vehicle or monomer alone. For example, a mixture of a sample of polymethacrylic acid and acrylamide melts at 56° C. whereas each of the constituents melts at 120° C. and 84.5° C., respectively. In the present invention, therefore, the solid, inorganic photocatalysts for use in the invention must be photosensitive and capable of effecting photopolymerization of the monomeric component in a composition which may comprise a vehicular substance.

When preparing the photopolymerizable compositions for use in this invention, it is usually necessary that the monomeric component be soluble in the solvent used such that a homogeneous mixture is prepared. The solvent-insoluble metallic inorganic photocatalyst is then added to this mixture with agitation to assure uniform distribution of the photocatalyst throughout the medium. The monomeric component is usually present in an amount from about 10 percent to about 65 percent by weight of the total composition. The amount of solvent used in preparing a particular photopolymerizable composition is not critical, and the minimum operable amount need only be sufficient to form a true liquid solution. Amounts of solvent up to 90 percent and more of the entire solution can be used, although it is preferred that the amount of solvent not exceed 65 percent of the solution. To this composition, a vehicle or binder of choice can be added in preparing the composition for coating in a photographic element. The binder can be added in an amount by weight from about 5 percent to about 30 percent of the total polymerizable composition. Compositions such as these can be readily coated, cast or extruded onto suitable supporting materials, such as glass, ordinary cellulose acetate film base, and the like. According to the present invention, the resulting coated elements may be exposed to actinic radiation when in the wet form or they may be dried and exposed in the dried form. The resulting coated elements when dry are non-tacky and can be readily stored for considerable periods of time at normal room temperatures and humidities. Upon exposure of the light-sensitive layer of the photographic element to actinic light through a stencil or an original by reflex copying or through a process transparency for a transparent area and opaque area polymerization, the lightstruck areas become polymerized and are rendered essentially solvent insoluble by the action of actinic light on the polymerizable composition. Unexposed portions of the layer which are thus unhardened can thereafter by removed with a solvent of choice with the result that a sharp reproduced image is obtained. The polymerized coating is also a good mordant for dyes and permits the formation of continuous tone reproductions from photographic negatives. Alternatively, the photopolymerizable composition of this invention can be coated on a suitable support, dried, exposed, and by applying mild heat when in contact with a receiver sheet, a transfer of the unexposed, unhardened areas can be made to a second support. The second support having a matrix of transferred imagewise composition is then hardened by further exposure to actinic light of the entire transferred stratum. A suitable receiver sheet or second support may comprise a Kodak Verifax Copy Paper. The photopolymerizable compositions of our invention employ as the essential constituents (a) an ethylenically unsaturated monomer, and (b) a solid, inorganic initiator of photopolymerization. The compositions can also include a vehicular substance. In preparing the photopolymerizable compositions, the photo-initiator component should be substantially insoluble in the overall composition, and should be substantially uniformly distributed throughout the entire photopolymerizable composition so that upon coating a suitable support, equal and uniform distribution of the photo-initiator is assured. The solid, inorganic photocatalysts of our invention can be present in the photopolymerizable compositions on preparation in an amount ranging from about 1.0 percent to about 30.0 percent by weight of the entire composition, with especially useful quantities being in the range from about 4 percent to about 12 percent. Of the solid, inorganic photocatalysts certain of them are particularly well adapted to the preparation of photographic elements which have an improved storage-stability. The photocatalysts to which we refer are sulfides of cadmium and zinc which have been prepared as hereinbefore described, but prepared in the absence of activating radiation within the wavelengths depressing catalytic activity of said photocatalysts and remaining in the absence of such activating radiation until photographic exposure of the photopolymerizable composition. Suitable light for preparation can comprise photographic safe-light conditions. The unfogged cadmium sulfide and zinc sulfide photocatalysts can be incorporated in the photopolymerizable composition in the same manner and in similar concentrations as photocatalysts prepared under white light except that care should be taken to protect the unfogged photocatalyst from a white light exposure at any point in the preparation of the photographic elements.

In making the coating of a photopolymerizable composition containing an initiator of polymerization, a wet coating thickness of from about 0.003 inch to about 0.015 inch is suitable, with a preferred wet coating thickness in the range from about 0.006 inch to about 0.010 inch. When dried, of course, the coatings have a measured thickness somewhat less than the original wet thickness. Polymerizable coatings in this thickness range are readily photopolymerizable and transfer readily to a support according to the mild heat transfer process herein described.

The following examples will serve to illustrate more fully the manner of catalyzing the polymerization of ethylenically unsaturated monomers using inorganic photocatalysts. The coatings were prepared as described in the examples, some were exposed to radiation from a 250-watt British Thompson-Houston Type ME/D mercury arc. Placed between the illuminating source and the coating was a 500-mm. Bausch and Lomb Grating Monochromator. The light output was measured with a Weston photocell. This photocell was calibrated with a thermopile-galvanometer combination which had been standardized with Bureau of Standards lamps C–52 and C–675. Suitably employed in the following examples also is a General Electric No. 2 Reflector Flood Lamp and General Electric Osira lamps having two 400-watt high pressure mercury vapor tubes.

The following examples will serve as guides for easily determining the most useful concentration of a particular solid, inorganic photocatalyst for a given purpose and the amount of radiation normally required to produce optimum polymerization.

*Example 1*

One gram of zinc oxide precipitate was mixed with 12.5 grams of an aqueous solution containing 30 percent by weight of acrylamide. The thick mixture was then coated on ordinary cellulose acetate film base, covering an area of 32.5 cm.$^2$. The coating was then exposed in air to $4\times10^{16}$ quanta/cm.$^2$ of 365 m$\mu$ radiation. After exposure, the coating was washed with a current of water which removed the unexposed areas. The exposed area was not soluble in water and adhered to the cellulose acetate support.

*Example 2*

One gram of titanium dioxide precipitate was mixed with 12.5 grams of an aqueous solution which had been obtained by dissolving 500 grams of acrylic acid and 10 grams of sodium sulfite in 1 liter of water. The resulting mixture was then coated on an ordinary cellulose acetate film base, covering an area of 32.5 cm.$^2$. The coating was exposed in air to $6\times10^{17}$ quanta/cm.$^2$ of 365 m$\mu$ radiation. After exposure, the unexposed areas were soluble in water and were removed with a current of water applied to the film surface. The exposed areas were not water-soluble and adhered to the support.

*Example 3*

One gram of lead bromide precipitate formed by a chemical interaction of lead acetate and potassium bromide was thoroughly washed with water and mixed with 12.5 grams of an aqueous solution which had been obtained by dissolving 300 grams of acrylamide and 20 grams of sodium sulfite in 1 liter of water. The resulting mixture was then coated on an ordinary glass surface, covering an area of 32.5 cm.$^2$. The coating was exposed in air to $1.4\times10^{18}$ quanta/cm.$^2$ of 365 m$\mu$ radiation. After exposure, the unexposed areas of the exposed surface were washed away with a current of water. The exposed areas remained adhered to the glass surface.

*Example 4*

One gram of cadmium sulfide prepared by bubbling gaseous hydrogen sulfide through an aqueous cadmium chloride solution was washed five times with distilled water and then mixed with 12.5 grams of an aqueous solution which had been obtained by dissolving 300 grams of acrylamide and 20 grams of sodium sulfite in 1 liter of water. The resulting mixture was then coated on an ordinary glass surface, covering an area of 32.5 cm.$^2$. The coating was exposed to $2\times10^{17}$ quanta/cm.$^2$ of 436 m$\mu$ radiation. After exposure, the unexposed areas of the coating were washed away with a current of water while the exposed areas were not soluble and remained adhered to the glass support.

*Example 5*

Unfogged zinc sulfide photocatalyst was prepared by passing hydrogen sulfide gas with good stirring into 2 liters of water containing 68.2 grams zinc chloride and 41.0 grams of sodium acetate until precipitation was complete. The reaction was carried out under a Wratten Series 1 Safelight. The ZnS slurry was then washed twice by decantation, adjusted to a volume of 240 milliliters with distilled water, and set aside in the dark for use in the following composition:

| | | |
|---|---|---|
| Zinc sulfide slurry | ml | 7.5 |
| Alcohol | ml | 7.0 |
| Monostearin | g | 0.75 |
| Acrylamide | g | 2.0 |
| Glycerol | drops | 8 |

The mixture was coated warm on hydrolyzed acetate film base at 0.006-inch wet thickness and dried. The coating was exposed from behind a continuous-tone negative to $4\times10^{16}$ quanta/cm.$^2$ of 365 m$\mu$ radiation from two 400-watt high pressure mercury vapor tubes (e.g., Osira lamps by General Electric Company, Ltd.). An image of good definition was then obtained by transfer to a paper receiving sheet using mild heat (70° C.) and pressure (approximately 10 p.s.i.).

Transferred images of substantially the same definition and quality can be obtained after a dark storage period of several days where unfogged zinc sulfide photocatalyst is used in the dried coatings of light-sensitive photopolymerizable elements, whereas coatings containing fogged zinc sulfide give low-grade transfers. When we refer herein to fogged and unfogged photocatalysts, we refer to the method of preparation of the photocatalyst, i.e., unfogged photocatalysts are prepared and handled in the absence of actinic radiation whereas fogged photocatalysts are prepared under normal white light illumination. Improved storage-stability is obtained where the photocatalyst is prepared and incorporated in the photopolymerization composition in the unfogged state.

*Example 6*

90.8 grams of red mercuric iodide (Merck and Company) was mixed with 66.4 grams of potassium iodide (Baker and Adamson) and enough water to form 1 liter of solution. This mixture was then mixed with an aqueous solution saturated with hydrogen sulfide to form a yellow-orange precipitate of mercuric iodo-sulfide. The precipitate was then washed twice with water and mixed with a 400 grams per liter aqueous solution of acrylamide, coated 0.006 inch thick on cellulose acetate film base, and exposed to $1\times10^{17}$ quanta/cm.$^2$ of 546 m$\mu$ radiation. After exposure, the mercuric iodosulfide-acrylamide polymer formed in the exposed areas was not removed by washing with water.

Similar results were obtained where mercuric iodide was substituted in this example for mercuric-iodosulfide.

*Example 7*

One gram of zinc sulfide precipitate prepared by bubbling hydrogen sulfide gas through an aqueous solution of zinc chloride was washed five times by decantation and mixed with 20 grams of an aqueous acrylamide solution. An aqueous acrylamide solution was obtained by mixing 400 grams acrylamide in 1 liter of water. The mixture was coated on an ordinary cellulose acetate film base at a wet thickness of 0.006 inch. The coating was then exposed to $4\times10^{16}$ quanta/cm.$^2$ of 365 m$\mu$ radiation. The exposed coating was then developed by washing away the unexposed, unpolymerized areas.

*Example 8*

Thallous bromide precipitate was prepared by precipitation from solutions of thallous nitrate and potassium bromide contained at 1 gram of each per liter of water. The precipitate was then washed five times by decantation. Two grams of acrylamide was dissolved in 5 ml. of the wet precipitate and three separate coatings were made onto glass supports at a thickness of 0.006 inch. Each coating was then exposed, respectively, to $3\times10^{17}$ quanta/cm.$^2$ of 365 m$\mu$, 405 m$\mu$, and 436 m$\mu$ radiation. A polymer image formed at each wavelength in each coating separately exposed. In each coating the unexposed areas were washed away with water leaving a polymer image adhered to the support.

*Example 9*

Eight grams of bismuth trichloride (Baker and Adamson) was added to 5 ml. of water. Two grams of acrylamide was dissolved in this mixture and a coating was made onto a glass surface at a thickness of 0.010 inch. The coating was exposed to $2\times10^{17}$ quanta/cm.$^2$ of 365 m$\mu$ radiation. A polymer image formed in the irradiated area.

*Example 10*

The following formula was coated at 0.003 inch wet thickness on ordinary cellulose acetate film base and dried at room temperature.

| | | |
|---|---|---|
| Cadmium sulfide slurry (2 parts water, 1 part CdS by weight) | ml | 10.0 |
| Acrylamide | g | 1.0 |
| Carbowax 4,000 | g | 2.0 |

The cadmium sulfide slurry was prepared by passing hydrogen sulfide gas with good stirring into a two liter volume of distilled water containing 57.1 grams of cadmium chloride until precipitation of CdS was complete. The reaction was carried out under ortho-dark conditions in Kodak Series 1 Safelight. The CdS precipitate was then washed five times by decantation with distilled water and the volume of the slurry made to 240 ml. The slurry was then stored in the dark until used.

The coating comprised of the above composition was exposed for 1 minute at a distance of 6 inches from a G.E. No. 2 Reflector Flood Lamp from behind a line negative having transparent areas and opaque areas. After exposure, the coating was rolled under pressure at a temperature of 50° to 70° C. in contact with a Kodak Verifax Copy Paper receiver sheet. The unexposed areas, i.e., unpolymerized areas, transferred readily to the receiver sheet to produce an image thereon having good definition.

*Example 11*

The following formula was coated onto ordinary cellulose acetate film base at a wet thickness from 0.002 inch to 0.012 inch.

| | | |
|---|---|---|
| Cadmium sulfide slurry (prepared as in Example 10) | ml | 60 |
| Carbowax 20,000 | g | 9 |
| Acrylamide | g | 6 |

The coatings comprising the above composition were exposed and transferred to a Verifax receiver sheet as in Example 10. According to this example, the thicker coatings, that is, from about 0.008 inch to about 0.012 inch produced transfers of better definition than did the coatings of less than 0.006 inch. The images produced by the process of this example were suitable for use as a printing relief.

*Example 12*

The following formula was coated on a paper support at 0.006 inch wet thickness and dried.

| | | |
|---|---|---|
| Cadmium sufide slurry (prepared as in Example 10) | ml | 3.0 |
| Calcium acrylate | g | 1.0 |
| 5% zein in 75% ethanol | ml | 3.0 |
| Glycerol | ml | 0.3 |
| Triton X-200 Wetting Agent (Rohm and Haas Co.) | ml | 0.3 |

The dry coating was then exposed for 30 seconds at a distance of 1 foot from a G.E. No. 2 Reflector Flood Lamp from behind a line positive. The exposed coating was then rolled under pressure at a temperature of 85° C. in contact with a Kodak Verifax Copy Paper receiver sheet. The unexposed unpolymerized areas of the coating transferred readily to the receiver sheet to produce an image thereon having good definition.

*Example 13*

The following example illustrates a photographic application using unfogged cadmium sulfide photocatalyst, i.e., darkness prepared cadmium sulfide precipitate.

Unfogged cadmium sulfide precipitate was prepared as follows.

57.1 grams of cadmium chloride was dissolved in 2 liters of distilled water, into which was passed hydrogen sulfide gas under good stirring conditions. The reaction was carried out under ortho-dark conditions using Kodak Series 1 Safelight until precipitation was complete. The unfogged cadmium sulfide formed was washed five times by decantation and the volume of the slurry adjusted to 240 ml. The pH of the slurry was 4.0. The slurry was stored in the dark and handled only under Series 1 Safelight or briefly under Series 1A Safelight.

Ten ml. of the unfogged cadmium sulfide slurry was irradiated for 30 minutes at 3 inches from a G.E. No. 2 Reflector Flood Lamp. Five grams of acrylamide was then dissolved in the slurry in the dark. Five grams of acrylamide was also dissolved in another 10 ml. sample of cadmium sulfide slurry which was not exposed. Into each sample was then mixed a solution of the following composition:

| | | |
|---|---|---|
| Zein | g | 0.5 |
| Ethyl alcohol | ml | 7.5 |
| Glycerol | ml | 0.7 |
| Water | ml | 2.5 |

Two coatings of each mixture were then coated onto four separate supports at 0.006 inch wet thickness and dried. The support used was ordinary cellulose acetate film base. One plate of each sample was placed in a dark room-temperature storage while one plate of each sample was exposed for 1 minute at 1 foot with a G.E. No. 2 Reflector Flood Lamp. The exposure was made from behind a transparency comprising opaque areas and clear areas. Each coating after exposure was placed in contact with a Kodak Verifax Copy Paper receiving sheet and a transfer of the non-exposed unpolymerized areas of the dry coating was made to the receiver sheet when mild heat (75° to 90° C.) was applied. After a nine-day dark storage period each of the stored plates was exposed and a transfer made to a receiving sheet in the same manner. The transferred image obtained from the plate coated with the non-irradiated sample was of improved definition over the image obtained from the plate coated with the irradiated sample.

In preparing any of the solid, inorganic initiators of photopolymerization according to the present invention, it is important that the precipitates be in finely-divided form. By virtue of such fine division of the photocatalytic materials, it is possible to obtain a more uniform distribution of the materials. In a photopolymerizable composition which has the photocatalytic materials uniformly distributed, the polymerized result is likewise more uniform having distinct polymerized and non-polymerized areas. Uniform distribution of catalytic materials also tends to improve the speed of the polymer-forming coatings.

The photopolymerizable compositions of this invention can be used in document reproduction as well as in the preparation of printing reliefs and continuous tone positives. The printing reliefs made in accordance with the invention are not deleteriously affected by conventional printing inks and printing plate cleaning solutions.

Polymerizable layers made from the compositions described hereinabove due to the high degree of compatibility of the components thereof, are firm and substantially tack-free when dry, exhibit no exudation and result in printing reliefs of high quality.

The advantages accruing as a result of this invention are the advantages of requiring only inexpensive, readily available materials, and without the need for chemical activators, accelerators, and the like to produce a photopolymerized image suitable for use in a photographic application. This is particularly advantageous in the photographic industry where the application of new processes is made by many persons under varying condtiions. Other advantages accruing are the advantages obtained where photopolymerization can be carried out using dried coatings of the compositions. The dry coatings, according to our invention can be prepared at a convenient time in advance of their use in a photographic application. Another advantage accrues by the process of our invention in that optimum physical characteristics can be achieved where the polymerized result can be produced in a dry coating employing mixtures of polymer-forming compounds selected from the class comprising water-soluble, ethylenically-unsaturated monomers as well as organic solvent-soluble monomeric compounds and suitable mixtures thereof.

Although the intended application of the solid, inorganic initiators of photopolymerization of our invention is directed to use in photography and to applications related thereto, it is apparent that the process compositions employing such photocatalysts can also be used in bulk-type photopolymerization reactions.

When in the appended claims we use the word "fluid," we mean to include pastes and true liquids.

The invention has been described in detail with particular reference to preferred embodiments thereof, but it will be understood that variations and modifications can be effected within the scope and spirit of the invention as described hereinabove and as defined in the appended claims.

We claim:

1. A dry thermal process for transferring underexposed photographic images from a stratum on a support to a separate support, said stratum being solid below 50° C. and containing:

(1) underexposed image areas which are thermally transferable by having a stick or transfer temperature in the range from 50° C. to 90° C., comprising (a) a thermoplastic compound solid at 50° C. and (b) an ethylenically unsaturated compound containing at least one terminal ethylenic group, having a boiling point above 100° C. at normal atmospheric pressure, being capable of forming a high polymer by photoinitiated addition polymerization and having a plasticizing action on said thermoplastic compound, said constituents (a) and (b) constituting from 5% to 30% and from 10% to 65% respectively of the composition of said stratum, and (c) a small amount of an addition polymerization initiator activatable by actinic light constituting from 1% to 30% of the composition of said stratum, and (2) exposed complementary adjoining image areas solid at 50° C., non-thermally transferable at said stick or transfer temperature at which the underexposed areas are thermally transferable, and comprising an addition polymer of an aforesaid ethylenically unsaturated compound and said thermoplastic compound;

said process comprising:

(A) placing the outer surface of said stratum into contact with the image-receptive surface of a separate element, (B) heating at least one of said elements to a temperature of at least 50° C. but less than the melting point of the complementary image areas while said surfaces are in contact to selectively soften the underexposed image areas of said stratum, and (C) separating the two elements whereby the thermally transferable, underexposed image areas of the stratum are transferred to the image-receptive element.

2. A process according to claim 1 wherein said ethylenically unsaturated compound contains 1 to 4 terminal ethylenic groups.

3. A process as defined in claim 1 wherein said separate support is paper.

4. A process as defined in claim 1 wherein the thermally transferable image areas contain a colored material.

5. A process as defined in claim 1 wherein said thermoplastic polymeric compound is a cellulose ester.

6. A process as defined in claim 1 wherein the transferred images are exposed to actinic light until the ethylenically unsaturated compound is addition polymerized.

7. A process as defined in claim 1 wherein the element containing the transferred, underexposed image areas is wet with a solvent and the wet image areas are brought into contact with the image-receptive surface of a second separate element and the two elements are separated, whereby an image is transferred to the second image-receptive element.

8. A photopolymerizable composition comprising (A) a water-soluble, monoethylenically and terminally-unsaturated, monomeric compound and (B) a photocatalyst selected from the class consisting of cadmium sulfide, zinc sulfide and mercuric iodosulfide, said photocatalyst being prepared in the absence of activating radiation within the wavelengths depressing the catalytic activity of said photocatalyst and remaining in the absence of said activating radiation until photographic exposure of said photopolymerizable composition.

9. A photopolymerizable composition comprising (A) a monoethylenically and terminally-unsaturated, monomeric compound, (B) a photocatalyst selected from the class consisting of cadmium sulfide, zinc sulfide and mercuric iodosulfide, said photocatalyst being prepared in the absence of activating radiation within the wavelengths depressing the catalytic activity of said photocatalyst and remaining in the absence of said activating radiation until photographic exposure of said photopolymerizable composition, and (C) sufficient water to render said composition fluid, said composition being substantially free of other polymerization catalysts.

10. A photopolymerizable composition comprising (A) a water-soluble acrylic monomer and (B) cadmium sulfide, said sulfide being prepared in the absence of activating radiation within the wavelengths depressing the catalytic activity of said sulfide and remaining in the absence of said activating radiation until photographic exposure of said photopolymerizable composition.

11. A photopolymerizable composition comprising (A) a water-soluble acrylic monomer and (B) zinc sulfide, said sulfide being prepared in the absence of activating radiation within the wavelengths depressing the catalytic activity of said sulfide and remaining in the absence of said activating radiation until photographic exposure of said photopolymerizable composition.

12. A photopolymerizable composition comprising (A) a water-soluble acrylic monomer and (B) mercuric iodosulfide, said iodosulfide being prepared in the absence of activating radiation within the wavelengths depressing the catalytic activity of said iodosulfide and remaining in the absence of said activating radiation until photographic exposure of said photopolymerizable composition.

13. A photopolymerizable composition comprising (A) a water-soluble acrylic monomer, (B) cadmium sulfide, said sulfide being prepared in the absence of activating radiation within the wavelengths depressing the catalytic activity of said sulfide and remaining in the absence of said activating radiation until photographic exposure of said photopolymerizable composition and (C) sufficient water to render said composition fluid, said composition being substantially free of other polymerization catalysts.

14. A photopolymerizable composition comprising (A) a water-soluble acrylic monomer, (B) zinc sulfide, said sulfide being prepared in the absence of activating radiation within the wavelengths depressing the catalytic activity of said sulfide and remaining in the absence of said activating radiation until photographic exposure of said photopolymerizable composition and (C) sufficient water to render said composition fluid, said composition being substantially free of other polymerization catalysts.

15. A photopolymerizable composition comprising (A) a water-soluble acrylic monomer, (B) mercuric iodosulfide, said iodosulfide being prepared in the absence of activating radiation within the wavelengths depressing the catalytic activity of said iodosulfide and remaining in the absence of said activating radiation until photographic exposure of said photopolymerizable composition and (C) sufficient water to render said composition fluid, said composition being substantially free of other polymerization catalysts.

16. A photographic element for photomechanical reproduction comprising a support having coated thereon a photopolymerizable composition comprising (A) a water-soluble, monoethylenically and terminally-unsaturated, monomeric compound, (B) a photocatalyst selected from the class consisting of cadmium sulfide, zinc sulfide and mercuric iodosulfide, said photocatalyst being prepared in the absence of activating radiation within the wavelengths depressing the catalytic activity of said photocatalyst and remaining in the absence of said activating radiation until photographic exposure of said photopolymerizable composition and (C) sufficient water to render said composition fluid, said composition being substantially free of other polymerization catalysts.

17. A photographic element for photomechanical reproduction comprising a support having coated thereon a photopolymerizable composition comprising (A) a water-soluble acrylic monomer, (B) cadmium sulfide, said sulfide being prepared in the absence of activating radiation within the wavelengths depressing the catalytic activity of said sulfide and remaining in the absence of said activating radiation until photographic exposure of said photopolymerizable composition and (C) sufficient water to render said composition fluid, said composition being substantially free of other polymerization catalysts.

18. A photographic element for photomechanical reproduction comprising a support having coated thereon a photopolymerizable composition comprising (A) a water-soluble acrylic monomer, (B) zinc sulfide, said sulfide being prepared in the absence of activating radiation within the wavelengths depressing the catalytic activity of said sulfide and remaining in the absence of said activating radiation until photographic exposure of said photopolymerizable composition and (C) sufficient water to render said composition fluid, said composition being substantially free of other polymerization catalysts.

19. A photographic element for photomechanical reproduction comprising a support having coated thereon a photopolymerizable composition comprising (A) a water-soluble acrylic monomer, (B) mercuric iodosulfide, said iodosulfide being prepared in the absence of activating radiation within the wavelengths depressing the catalytic activity of said iodosulfide and remaining in the absence of said activating radiation until photographic exposure of said photopolymerizable composition and (C) sufficient water to render said composition fluid, said composition being substantially free of other polymerization catalysts.

20. A dry photographic element for photomechanical reproduction comprising a flexible sheet support having coated thereon a photopolymerizable composition comprising (A) a water-soluble acrylic monomer and (B) cadmium sulfide, said sulfide being prepared in the absence of activating radiation within the wavelengths depressing the catalytic activity of said sulfide and remaining in the absence of said activating radiation until photographic exposure of said photopolymerizable composition.

21. A dry photographic element for photomechanical reproduction comprising a flexible sheet support having coated thereon a photopolymerizable composition comprising (A) a water-soluble acrylic monomer and (B) zinc sulfide, said sulfide being prepared in the absence of activating radiation within the wavelengths depressing the catalytic activity of said sulfide and remaining in the absence of said activating radiation until photographic exposure of said photopolymerizable composition.

22. A dry photographic element for photomechanical reproduction comprising a flexible sheet support having coated thereon a photopolymerizable composition comprising (A) a water-soluble acrylic monomer and (B) mercuric iodosulfide, said iodosulfide being prepared in the absence of activating radiation within the wavelengths depressing the catalytic activity of said iodosulfide and remaining in the absence of said activating radiation until photographic exposure of said photopolymerizable composition.

23. A photographic element for photomechanical reproduction comprising a flexible sheet support having coated thereon a photopolymerizable composition comprising (A) a water-soluble acrylic monomer, (B) a photocatalyst selected from the class consisting of cadmium sulfide, zinc sulfide and mercuric iodosulfide, said photocatalyst being prepared in the absence of activating radiation within the wavelengths depressing the catalytic activity of said photocatalyst and remaining in the absence of said activating radiation until photographic exposure of said photopolymerizable composition, (C) a vehicular substance capable of producing a mixed melting point depression with said acrylic monomer so that said photopolymerizable composition has a melting point substantially lower than either of said vehicular substance and said acrylic monomer, and (D) sufficient water to render said photopolymerizable composition fluid, said photopolymerizable composition being substantially free of other polymerization catalysts.

24. A photographic element as defined in claim 23 wherein said vehicular substance (C) is selected from the class consisting of zein, nylon, monostearin and a polyethylene glycol having a molecular weight of at least about 4000.

References Cited

UNITED STATES PATENTS

| | | | |
|---|---|---|---|
| 1,587,274 | 6/1926 | Beebe et al. | 96—115 |
| 1,618,505 | 2/1927 | Bebee et al. | 96—28 X |
| 2,380,280 | 7/1945 | Weyarts | 96—107 |
| 2,480,749 | 8/1949 | Marks | 96—115 |
| 2,500,023 | 3/1950 | Burk | 96—115 |
| 2,875,047 | 2/1959 | Oster | 96—115 |
| 2,924,561 | 2/1960 | Schmerling | 96—115 |
| 3,003,869 | 10/1961 | Schaffert et al. | 96—1 |
| 3,042,516 | 7/1962 | Wainer | 96—115 X |
| 3,042,518 | 7/1962 | Wainer | 96—115 X |
| 3,060,022 | 10/1962 | Duerr | 96—28 |
| 3,060,023 | 10/1962 | Burg | 96—28 |
| 3,065,160 | 11/1962 | Levinos | 96—35 X |

OTHER REFERENCES

Schwerin et al.: (German Auslegeschrift) 1,085,423, July 14, 1960.

Handbook of Chemistry & Physics, 35th ed., 1953–1954, Chemical Rubber Publishing Co., pp. 550–551.

NORMAN G. TORCHIN, *Primary Examiner.*

HAROLD N. BURSTEIN, M. STERMAN, *Examiners.*

R. L. STONE, C. L. BOWERS, Jr., *Assistant Examiners.*